United States Patent
Boernert et al.

(10) Patent No.: US 8,847,593 B2
(45) Date of Patent: Sep. 30, 2014

(54) ACCELERATED B1 MAPPING

(75) Inventors: Peter Boernert, Hamburg (DE); Kay Nehrke, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 469 days.

(21) Appl. No.: 13/257,317

(22) PCT Filed: Mar. 22, 2010

(86) PCT No.: PCT/IB2010/051225
§ 371 (c)(1),
(2), (4) Date: Sep. 19, 2011

(87) PCT Pub. No.: WO2010/113062
PCT Pub. Date: Oct. 7, 2010

(65) Prior Publication Data
US 2012/0007600 A1 Jan. 12, 2012

(30) Foreign Application Priority Data
Mar. 31, 2009 (EP) .................................. 09156820

(51) Int. Cl.
G01V 3/00 (2006.01)
(52) U.S. Cl.
USPC ......................................... 324/309; 324/318
(58) Field of Classification Search
USPC ................................................ 324/309, 318
See application file for complete search history.

(56) References Cited

U.S. PATENT DOCUMENTS 7,078,901 B2 * 7/2006 Feiweier et al. .............. 324/318
7,279,901 B2 10/2007 Diehl et al.

OTHER PUBLICATIONS

Alagappan, V., et al.; Mode Compression of Transmit and Receive Arrays for Parallel Imaging at 7T; 2008; Proc. Intl. Soc. Mag. Reson. Med.; 16:619.
Alagappan, V., et al.; Degenerate Mode Band-Pass Birdcage Coil for Accelerated Parallel Excitation; 2007; MRM; 57:1148-1158.
Breuer, F. A., et al.; The use of principal component analysis (PCA) for estimation of the maximum reduction factor in 2D parallel imaging; 2005; Proc. Intl. Soc. Mag. Reson. Med.; 13:2668.
King, S. B., et al.; Eigenmode Analysis for Understanding Phased Array Coils and Their Limits; 2006; Concepts in Magnetic Resonance; Magnetic Resonance Engineering; 29B(1)42-49.

(Continued)

Primary Examiner — Brij Shrivastav

(57) ABSTRACT

A method comprises: performing a number of $B_1$ field mapping sequences (24) using a set of radio frequency transmit coils (11) to acquire a $B_1$ field mapping data set wherein said number is less than a number of radio frequency transmit coils in the set of radio frequency transmit coils; and determining coil sensitivities (30) for the set of radio frequency transmit coils based on the acquired B1 field mapping data set. In some embodiments, the performed $B_1$ field mapping sequences are defined by (i) performing a linear transform (40) on the set of radio frequency transmit coils to generate a set of orthogonal virtual radio frequency transmit coils (42) and (ii) selecting (44) a sub-set (46) of the set of orthogonal virtual radio frequency transmit coils that define the performed $B_1$ field mapping sequences.

15 Claims, 5 Drawing Sheets

(56) References Cited

OTHER PUBLICATIONS

Nehrke, K., et al.; Improved B1-Mapping for Multi RF Transmit Systems; 2008; Proc. Intl. Soc. Mag. Reson. Med.; 16:353.

Nehrke, K., et al.; Eigenmode Analysis of Transmit Coil Array for SAR-reduced B1 Mapping and RF Shimming; 2009; Proc. Intl. Soc. Mag. Reson. Med.; 17:368.

Nehrke, K., et al.; Eigenmode Analysis of Transmit Coil Array for Tailored B1 Mapping; 2010; MRM; 63:754-764.

Nistler, J., et al.; B1 homogenisation using a multichannel transmit array; 2006; Proc. Intl. Soc. Mag. Reson. Med.; 14:2471.

Zelinski, A. C., et al.; Sparsity-Enforced Coil Array Mode Compression for Parallel Transmission; 2008; Proc. Intl. Soc. Mag. Reson. Med.; 16:1302.

\* cited by examiner

ACCELERATED B1 MAPPING

FIELD OF THE INVENTION

The following relates to the magnetic resonance arts, magnetic resonance imaging arts, magnetic resonance spectroscopy arts, medical magnetic resonance imaging and spectroscopy arts, and related arts.

BACKGROUND OF THE INVENTION

Magnetic resonance (MR) image quality is dependent upon the uniformity of the $B_1$ transmit field. Toward this end, the radio frequency coils used for magnetic field excitation are designed to generate a substantially uniform $B_1$ transmit field over the field of view (FOV). This can be done by using a plurality or array of radio frequency transmit coils that are strategically placed respective to the FOV so as to collectively generate a substantially uniform $B_1$ transmit field over the FOV. Such design is imperfect, however. Moreover, a $B_1$ transmit field designed to be uniform in the unloaded state can be distorted by magnetic susceptibility of the subject. This is known as the subject loading effect, and this effect becomes pronounced at higher static $B_0$ magnetic field such as at static magnetic field of about 3 Tesla or higher. Even at lower static magnetic field, the subject loading effect may be non-negligible.

$B_1$ shimming can be used to enhance uniformity of the $B_1$ transmit field in either the unloaded or loaded state. Additionally or alternatively, $B_1$ transmit field inhomogeneity can be compensated mathematically during post-acquisition MR image reconstruction processing. A spatial map of the $B_1$ transmit field is an input for both $B_1$ shimming and post-acquisition mathematical compensation. In view of the subject loading effect, the $B_1$ transmit field is preferably mapped with the specific subject undergoing imaging loaded in the MR scanner and in the imaging position. In the alternative, the $B_1$ transmit field can be mapped with a phantom suitably similar to the subject loaded in the MR scanner.

In existing $B_1$ transmit field mapping MR sequences, measurements are performed for each individual transmit channel or coil in two- or three-dimensions. For an N-coil array where N indicates the number of coils, N transmit field mapping sequences are therefore performed. Unfortunately, these $B_1$ transmit field mapping MR sequences are relatively slow, and undesirably lengthen the imaging session time.

SUMMARY OF THE INVENTION

In accordance with certain illustrative embodiments shown and described as examples herein, a method comprises: performing a number of $B_1$ field mapping sequences using a set of radio frequency transmit coils to acquire a $B_1$ field mapping data set wherein said number is less than a number of radio frequency transmit coils in the set of radio frequency transmit coils; and determining coil sensitivities for the set of radio frequency transmit coils based on the acquired $B_1$ field mapping data set.

In accordance with certain illustrative embodiments shown and described as examples herein, a storage medium stores instructions executable by a digital processor to perform a method as set forth in the immediately preceding paragraph. In accordance with certain illustrative embodiments shown and described as examples herein, a digital processor is configured to perform a method as set forth in the immediately preceding paragraph. In accordance with certain illustrative embodiments shown and described as examples herein, a magnetic resonance system comprises: a magnetic resonance scanner; a set of radio frequency transmit coils; and a digital processor configured to perform a method as set forth in the immediately preceding paragraph, wherein the performing a number of $B_1$ field mapping sequences comprises causing the magnetic resonance scanner to perform said $B_1$ field mapping sequences using said set of radio frequency transmit coils.

One advantage resides in providing more efficient $B_1$ shimming.

Another advantage resides in providing more efficient $B_1$ transmit field mapping.

Further advantages will be appreciated by those of ordinary skill in the art upon reading and understand the following detailed description.

BRIEF DESCRIPTION OF THE DRAWINGS

The drawings are only for purposes of illustrating the preferred embodiments, and are not to be construed as limiting the invention. Corresponding reference numerals when used in the various figures represent corresponding elements in the figures.

DETAILED DESCRIPTION OF EMBODIMENTS

Figure 1:
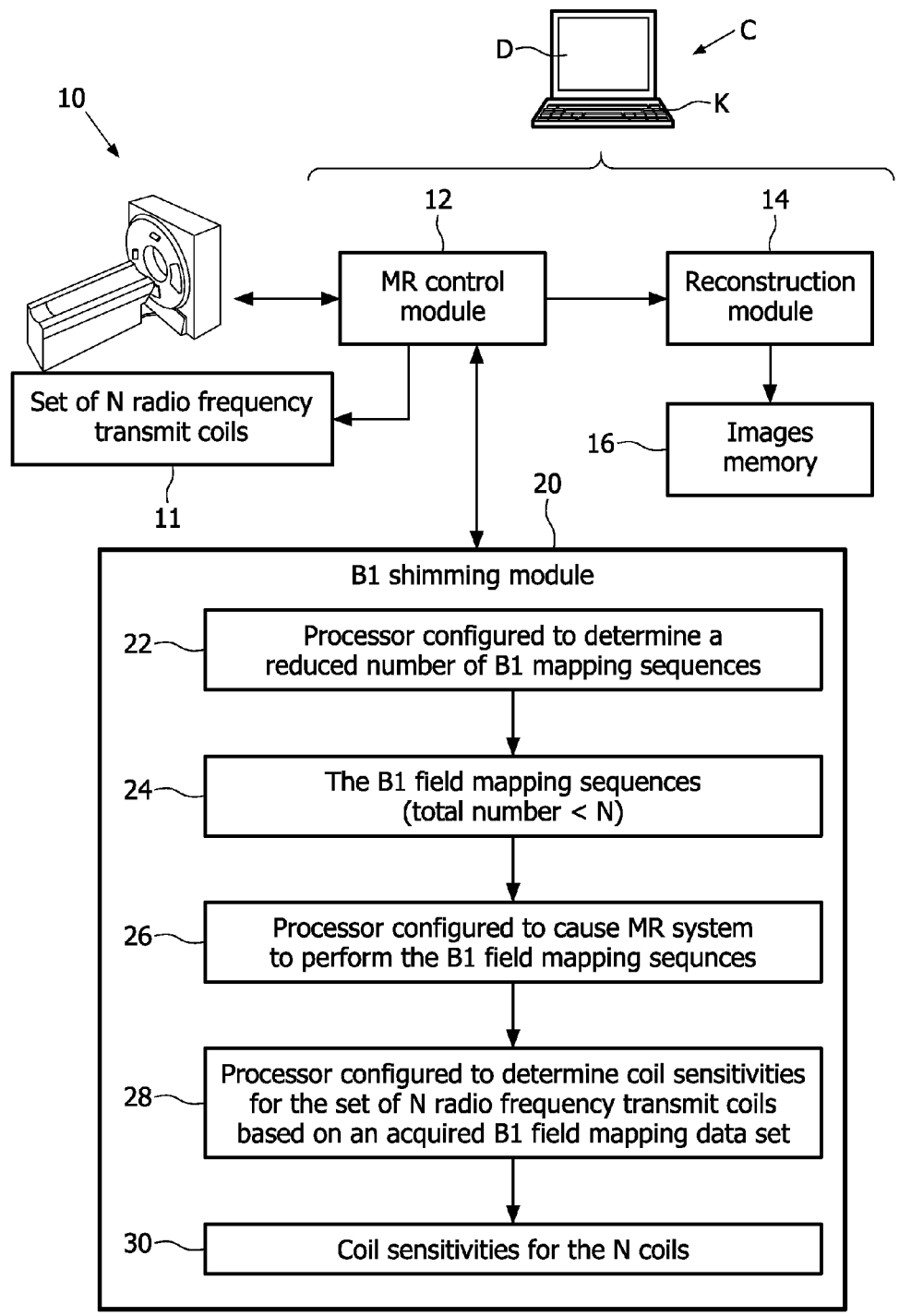
FIG. 1 diagrammatically shows a magnetic resonance system including or operating in conjunction with a set of radio frequency transmit coils and a $B_1$ shimming module.

With reference to FIG. 1, an imaging system includes a magnetic resonance (MR) scanner 10, such as an illustrated Achieva™ magnetic resonance scanner (available from Koninklijke Philips Electronics N.V., Eindhoven, The Netherlands), or an Intera™ or Panorama™ magnetic resonance scanner (both also available from Koninklijke Philips Electronics N.V.), or another commercially available magnetic resonance scanner, or a non-commercial magnetic resonance scanner, or so forth. In a typical embodiment, the magnetic resonance scanner includes internal components (not illustrated) such as a superconducting or resistive main magnet generating a static ($B_0$) magnetic field and sets of magnetic field gradient coil windings for superimposing selected magnetic field gradients on the static magnetic field.

The MR scanner also includes or operates in conjunction with a set of radio frequency transmit coils 11, which are N in number. For example, the set of radio frequency transmit coils 11 may be an array of eight transmit coils (in which case N=8), or may be an array of sixteen transmit coils (in which case N=16), an array of twenty transmit coils (in which case N=20), or so forth. The set of radio frequency transmit coils 11 can be embodied as an integral coil array unit in which a common housing or support contains or supports the N radio frequency transmit coils, or the N radio frequency transmit coils may be separately embodied as individual coil units, may have some combination of separate and grouped housings or supports, etc. In some embodiments, the set of radio frequency transmit coils 11 may be embodied as coil elements of a head coil unit, body coil unit, or other local coil assembly including plural coil elements. The MR scanner 10 further includes or operates in conjunction with one or more radio frequency receive coils, which may be embodied by the set of radio frequency transmit coils 11 (in which case the coils of the set of radio frequency transmit coils 11 are configured as transmit/receive or T/R coils) or may be embodied as one or more separate receive coils (not shown in FIG. 1).

The magnetic resonance scanner 10 and the set of radio frequency transmit coils 11 are controlled by a magnetic resonance control module 12 to execute a magnetic resonance sequence that defines the magnetic resonance excitation and receives magnetic resonance signals generated by the magnetic resonance excitation. In an illustrative MR imaging application, the set of radio frequency transmit coils 11 are energized to excite magnetic resonance which is spatially encoded by magnetic field gradients selectively applied by magnetic field gradient coils of the MR scanner 10, and the excited and spatially encoded magnetic resonance signals are read using the receive coil or coils. Optionally, the magnetic resonance excitation is spatially limited to a slice or other excitation region by a magnetic field gradient applied by magnetic field gradient coils of the MR scanner 10 during the magnetic resonance excitation phase.

For the illustrative imaging application, a reconstruction module 14 reconstructs acquired magnetic resonance signals to generate magnetic resonance images that are stored in a magnetic resonance images memory 16. For other applications, suitable post-acquisition processing is applied instead of or in combination with image reconstruction processing. For example, in an MR spectroscopy application, the MR signal from a selected location may be plotted as a function of frequency or the MR signal may be filtered based on frequency or so forth. In some embodiments, the components 12, 14, 16 are general purpose commercial magnetic resonance imaging products provided by the manufacturer of the magnetic resonance scanner 10 and/or by one or more third party vendors. Alternatively, one or more or all of the components 12, 14, 16 may be custom-built or customer-modified components.

With continuing reference to FIG. 1, a $B_1$ shimming module 20 operatively communicates with the MR system, for example with the MR control module 12, to cause the MR system to perform $B_1$ shimming to enhance spatial uniformity of the transmit $B_1$ field generated by the set of radio frequency transmit coils 11. Toward this end, a processor 22 is configured to determine a reduced number of $B_1$ mapping sequences for performing the $B_1$ mapping. By "a reduced number" it is meant that the number of $B_1$ mapping sequences to be performed is less than the number N of radio frequency transmit coils in the set of radio frequency transmit coils 11. The processor 22 outputs the $B_1$ field mapping sequences 24, whose number is less than N. A processor 26 is configured to cause the MR system 10, 11, 12 to perform the $B_1$ field mapping sequences 24 so as to generate a $B_1$ field mapping data set. A processor 28 is configured to determine coil sensitivities 30 for the set of N radio frequency transmit coils 11 based on an acquired $B_1$ field mapping data set.

FIG. 1 illustrates the shimming module 20 comprising separately illustrated processors 22, 26, 28, but in some embodiments the processors 22, 26, 28 may be embodied as a singular processor, which optionally is a same processor embodying the MR control module 12. For example, an illustrated computer C suitably includes a digital processor (not shown) that is programmed by software stored on a storage medium (such as a hard disk or other magnetic disk, an optical disk, a FLASH memory or other electrostatic memory, a random access memory, a read-only memory, or so forth) to embody the various components 12, 22, 26, 28, and optionally also the reconstruction module 14. The illustrative computer C also includes a display D and one or more user input devices such as an illustrated keyboard K. For example, the display D can be used to display reconstructed images retrieved from the images memory 16, while the one or more user input devices K can be used to enable a radiologist or other user to input commands for operating the MR system 10, 11, 12, the reconstruction module 14, and the $B_1$ shimming module 20.

The generated coil sensitivities 30 are suitably used to perform $B_1$ shimming of the set of radio frequency transmit coils 11 during the transmit phase of magnetic resonance sequences performed by the MR system 10, 11, 12, so as to enhance the spatial uniformity of the $B_1$ transmit field generated by the set of radio frequency transmit coils 11 at least within a field of view (FOV).

Efficiency of the shimming module 20 is facilitated by making the number of the $B_1$ field mapping sequences 24 substantially less than the number N of transmit coils of the set of radio frequency transmit coils 11. In some embodiments, for example, the number of the $B_1$ field mapping sequences 24 is one-half of N, while in other embodiments the number of the $B_1$ field mapping sequences 24 is less than one-half of N. The processor 22 is configured to select the $B_1$ field mapping sequences 24 in such a way that the reduced number of $B_1$ field mapping sequences 24 is still able to provide most of the $B_1$ mapping information that is provided by a conventional set of $B_1$ field mapping sequences in which one $B_1$ field mapping sequence is performed for each transmit coil (N sequences).

Figure 2:
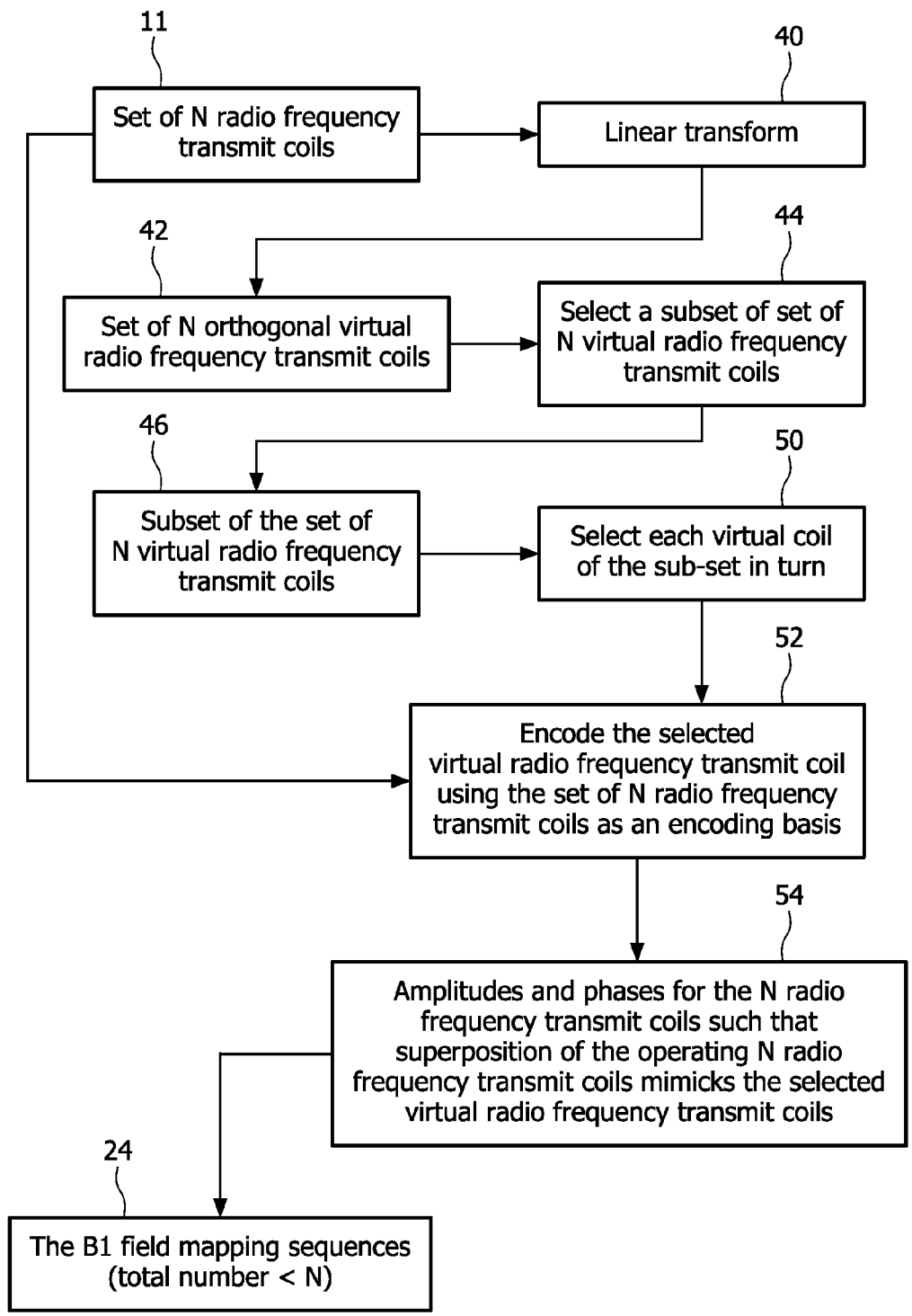
FIG. 2 flowcharts a process suitably performed by the processor of the $B_1$ shimming module of FIG. 1 which is configured to determine a reduced number of $B_1$ mapping sequences.

With continuing reference to FIG. 1 and with further reference to FIG. 2, an illustrative process suitably performed by the processor 22 is described. A linear transform 40 is performed on the set of radio frequency transmit coils 11 to generate a set of orthogonal virtual radio frequency transmit coils 42. The linear transform 40 is suitably chosen to separate out higher frequency $B_1$ transmit field components from lower frequency $B_1$ transmit field components. For example, in some embodiments the linear transform 40 is suitably an eigenmode transform, for which higher eigenmodes typically embody the higher frequency $B_1$ transmit field components while lower eigenmodes typically embody lower frequency $B_1$ transmit field components. In a selection operation 44, a sub-set 46 of the set of orthogonal virtual radio frequency transmit coils 42 is selected. The sub-set 46 is suitably selected to substantially retain the lower frequency $B_1$ transmit field components while omitting from the selected sub-set 46 virtual radio frequency transmit coils that generate a $B_1$ transmit field with principally high spatial frequency content. For example, in embodiments in which the linear transform 40 is an eigenmode transform, the selection operation 44 suitably selects a plurality of virtual radio frequency transmit coils of the set of orthogonal virtual radio frequency transmit coils 42 which have the lowest eigenmode orders.

For example, consider an example in which the set of radio frequency coils 11 includes N=8 coils, and an eigenmode transform is used so that the set of orthogonal virtual radio frequency transmit coils 42 includes virtual radio frequency coils corresponding to eigenmodes 0-7. If it is desired that the number of $B_1$ field mapping sequences be one-half of the number of coils (that is, four $B_1$ field mapping sequences in this example), then the selection operation 44 suitably selects the sub-set 46 as consisting of the four virtual radio frequency coils corresponding to the lowest eigenmode orders 0-3.

Without being limited to any particular theory of operation, the $B_1$ shimming is expected to be best implemented as a spatially smooth operation. The $B_1$ shimming is expected to be effective in correcting gradual or large-scale spatial variations in $B_1$ transmit field corresponding to the lower spatial frequencies. On the other hand, the $B_1$ shimming is expected to be less effective in correcting abrupt or small-scale spatial variations in $B_1$ transmit field corresponding to the higher spatial frequencies. Accordingly, by retaining in the selected sub-set 46 those virtual radio frequency transmit coils that generate a $B_1$ transmit field with principally low spatial frequency components while omitting from the selected sub-set 46 those virtual radio frequency transmit coils that generate a $B_1$ transmit field with principally high spatial frequency content, the resulting sub-set 46 is expected to provide lower spatial frequency information that is readily correctable by $B_1$ shimming, while discarding higher spatial frequency information that the $B_1$ shimming is less likely to be effective for correcting.

The sub-set 46 of the set of orthogonal virtual radio frequency transmit coils 42 identifies the most pertinent $B_1$ mapping information that preferably is acquired by the $B_1$ field mapping sequences 24. However, the sub-set 46 is a representation in the basis of the linear transform 40. On the other hand, the $B_1$ field mapping sequences 24 are implemented using the set of N radio frequency transmit coils 11. Accordingly, each virtual radio frequency transmit coil of the sub-set 46 is selected in turn in a selection operation 50, and an encoding operation 52 is performed on the selected virtual coil. The encoding operation 52 encodes the selected virtual radio frequency transmit coil using the set of N radio frequency transmit coils as an encoding basis. The encoding operation 52 generates amplitudes and phases 54 for the N radio frequency transmit coils 11 such that superposition of the operating N radio frequency transmit coils 11 operating at the selected amplitudes and phases mimicks the selected virtual radio frequency transmit coil. This process 50, 52, 54 is repeated for each virtual coil of the sub-set 46 to generate the $B_1$ field mapping sequences 24. In sum, the set of orthogonal virtual radio frequency transmit coils 42 defines the $B_1$ field mapping sequences 24 via encoding operations 50, 52, 54.

Figure 3:
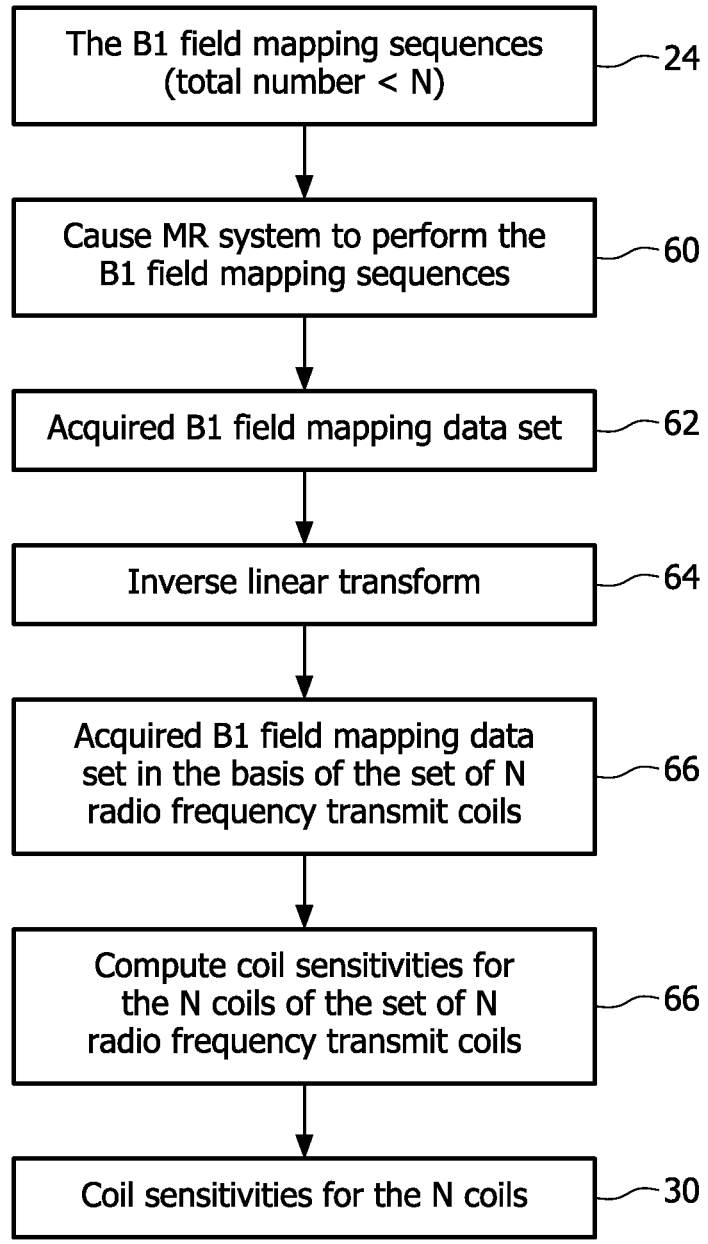
FIG. 3 flowcharts a process suitably performed by the processor or processors of the $B_1$ shimming module of FIG. 1 which is or are configured to cause the MR system to perform the $B_1$ mapping sequences to acquire a $B_1$ field mapping data set and to determine coil sensitivities for the set of N radio frequency transmit coils based on the acquired $B_1$ field mapping data set.

With continuing reference to FIG. 1 and with further reference to FIG. 3, an illustrative process suitably performed by the processors 26, 28 is described. The processor 26 performs operation 60 causing the MR system 10, 11, 12 to perform the $B_1$ field mapping sequences 24 that are determined by the processor 22. The acquisition operation 60 generates an acquired $B_1$ field mapping data set 62, whose components map the superposition of $B_1$ transmit fields corresponding to the sub-set 46 of virtual radio frequency transmit coils. In order to provide $B_1$ mapping for the radio frequency transmit coils of the physical set of radio frequency transmit coils 11, the acquired $B_1$ field mapping data set 62 is transformed, for example by an illustrated inverse linear transform 64 that is the inverse of the linear transform 40 (see FIG. 2), to generate a corresponding acquired $B_1$ field mapping data set 66 in the basis of the set of N radio frequency transmit coils 11. The $B_1$ field mapping data set 66 corresponds to a $B_1$ field mapping data set such as is conventionally acquired using N number of $B_1$ field mapping sequences performed serially using the N physical coils. Accordingly, a computation operation 68 computes the coil sensitivities 30 for the N coils of the set of N radio frequency transmit coils 11 from the $B_1$ field mapping data set 66. In some embodiments, the computation operation 68 operates ab initio to compute the coil sensitivities 30 for the N coils of the set of N radio frequency transmit coils 11. In other embodiments, a priori information about the coil sensitivities 30 is also utilized. For example, the a priori information about the coil sensitivities 30 may take the form of a stored set of coil sensitivities for the set of radio frequency transmit coils 11, and the computation operation 68 adjusts the stored set of coil sensitivities based on the acquired $B_1$ field mapping data set 66 represented in the basis of the set of N radio frequency transmit coils 11.

An illustrative example of the disclosed $B_1$ transmit mapping is described. The coil sensitivity distribution ($B_1$ map) of each individual coil of the set of radio frequency transmit coils 11 is transformed into an Eigen-coil system using an eigenmode transform that maps the physical coils 11, described by a matrix S, to a corresponding virtual eigenmode system in which the virtual coils correspond to eigenmodes. The rows of the matrix S form vectors that contain the spatial sensitivities of the individual transmit coils. The coil sensitivities S can be given in its singular values decomposition (SVD) representation as $S=U\times\Sigma\times V^H$ where the matrix $\Sigma$ contains the singular values, which correspond to the eigenvalues of the coil array. The matrix U, or more precisely the hermitian of U ($U^H$), acts as a projection matrix mapping the physical coils represented by matrix S onto the virtual coils corresponding to the eigenmodes E given by $E=U^H\times S$.

Instead of measuring the $B_1$ maps of the individual coils one can also measure their appropriate superposition which forms the eigenmodes. The eigenmodes can be ranked according to their contribution to the properties of the entire coil system, by the singular values given in matrix $\Sigma$. This ranking offers the opportunity to omit the least important eigenmode coils in a quantitative fashion, without losing significant informational content for the $B_1$ mapping. Rather, only a few of the eigenmodes which contribute most strongly to the $B_1$ mapping are measured.

Neglecting the eigenmodes that contribute little to the $B_1$ mapping information can mathematically be realized by applying a reduction operator R to the system according to $E'=R\times U^H\times S$ where E' denotes the reduced eigen-coil system. The operator R is similar to the unity matrix, but has zeros at the positions of the eigenmodes to be omitted during the $B_1$ mapping measurements. It will be appreciated that restricting the number of Eigen-modes to be measured is a general approach, and can be employed independent of the $B_1$ mapping sequence that is used to acquire the measurements. The $B_1$ mapping can be performed in either two-dimensions or three-dimensions. Based on coarse a-priori information about the coil sensitivities of the set of radio frequency transmit coils 11, the linear transforms to obtain the eigenmodes that contribute most information for the $B_1$ mapping can be estimated and the coil array can thus be considered as a coil consisting of a less number of virtual coil elements.

The measurement of the selected eigenmodes is optionally not performed directly. This approach recognizes that $B_1$ mapping sequences can have some inaccuracy. For example, the $B_1$ map may have a high dynamic range including spatial areas of low sensitivities. Higher eigenmodes contain lower signal energy and show more of these areas of low sensitivity, making it difficult to measure them with sufficient accuracy. Accordingly, in some embodiments the eigenmodes are encoded by a superposition of the modes using, for example, an "all-but-one" approach in which all but one of the physical coils 11 are used, so as to improve the accuracy of the $B_1$ mapping process. Letting a matrix A describe the superposition of the individual eigenmodes to form the modified coil modes Z according to an "all-but-one" encoding approach, which is applied during the different B1 mapping steps, the following can be written: $Z=A\times E'=A\times R\times U^H\times S$. The product ($A\times R\times U^H$) gives the amplitudes and phases for the individual transmit coil elements of the set of radio frequency transmit coils 11 for the $B_1$ mapping sequences. The coil sensitivity information S in the rightmost expression is suitably derived from a priori knowledge about the transmit coil array 11.

After the measurement, an appropriate transform obtained from the expression $Z=A \times E'=A \times R \times U^H \times S$ enables deriving the corresponding representations of the coil sensitivities 30 for the physical set of radio frequency transmit coils 11, which are then suitably used for $B_1$ shimming or for determining parallel transmission radio frequency pulse parameters. Designing the radio frequency pulses based on the sub-set of eigenmodes is also convenient. By operating in the eigenmode space, the total computation time can be reduced compared to computations operating in the basis of the physical coils 11.

Knowledge from previous coil sensitivity calibrations performed in two- or three-dimensions can also be utilized using an appropriate learning procedure. For example, the three-dimensional $B_1$ sensitivity matrix for each physical coil of the set of coils 11 can be stored in a matrix S'. This matrix serves as an average model of the coil sensitivities that is adjusted to derive the individual coil amplitudes and phases based on a new $B_1$ mapping measurement. As each new $B_1$ mapping measurement is performed in two- or three-dimensions, the stored model S' is suitably adjusted by incorporating the newly obtained information, for example using an appropriate weighted averaging process. This process optionally takes into account the reliability of the existing model S' at different spatial locations. The model S' can be stored in different formats, such as in the physical coordinate system (that is, the basis of the set of radio frequency transmit coils 11), or in the basis of the eigen-coil system. The latter storage approach allows for different levels of stored data accuracy, depending on the number of eigenvalues that are neglected. It is contemplated for the user to select this level of accuracy. Storing the sensitivities S' and adjusting the stored sensitivities with each $B_1$ mapping iteration is especially useful in the case of fixed installed transmit arrays, such as a body coil, in which the relative spatial arrangement between the coils of the set of radio frequency coils 11 is predefined by a common housing or support.

It is also advantageous that the specific absorption rate (SAR) for the $B_1$ mapping sequences can be estimated from the relationship $Z=A \times E'=A \times R \times U^H \times S$ by incorporating the information of the stored coils sensitivity information given in stored S'.

Figure 4:
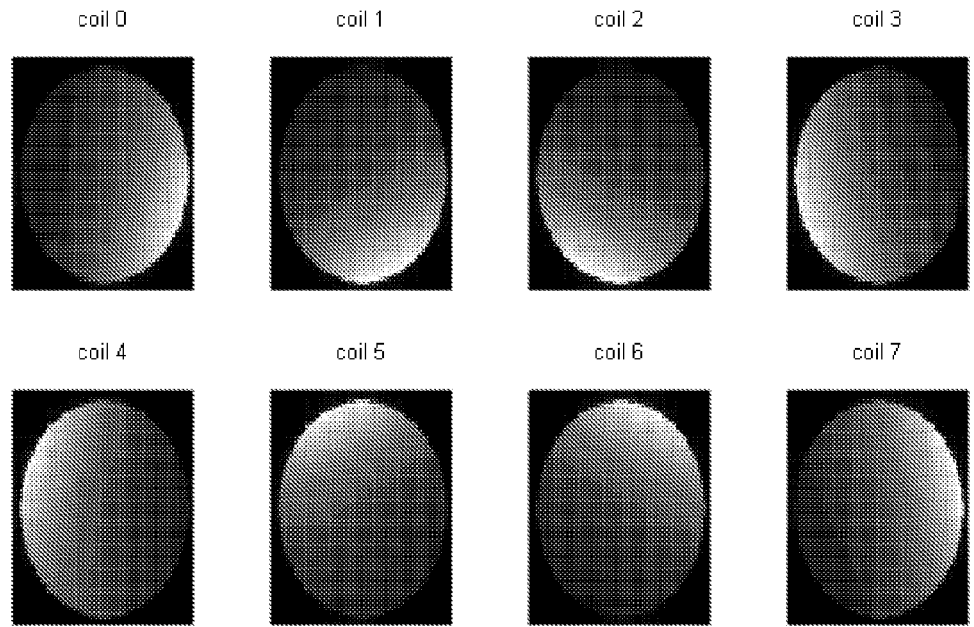
FIGS. 4-7 show some illustrative coil sensitivity maps.
Figure 5:
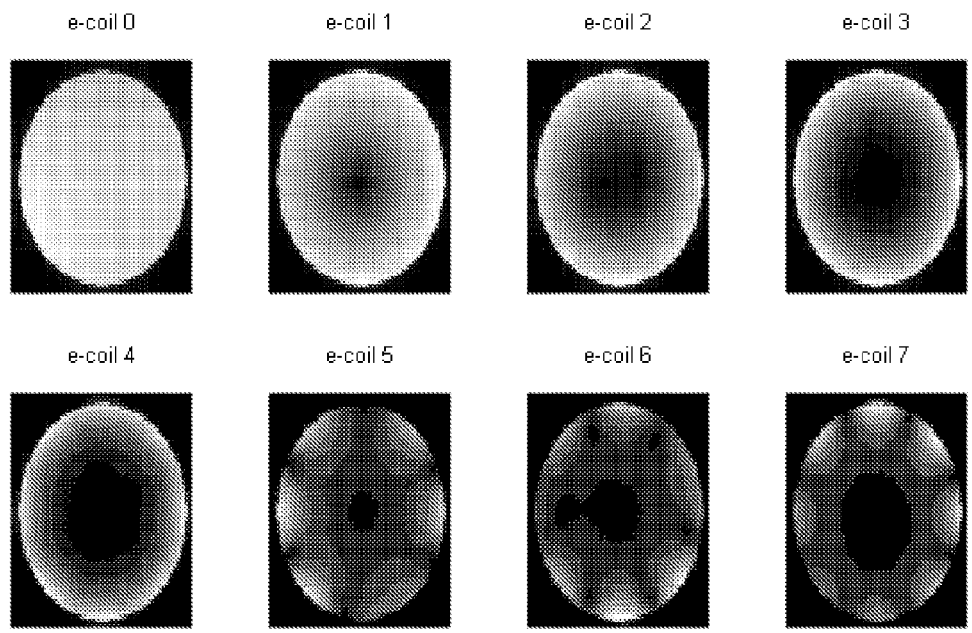
Figure 6:
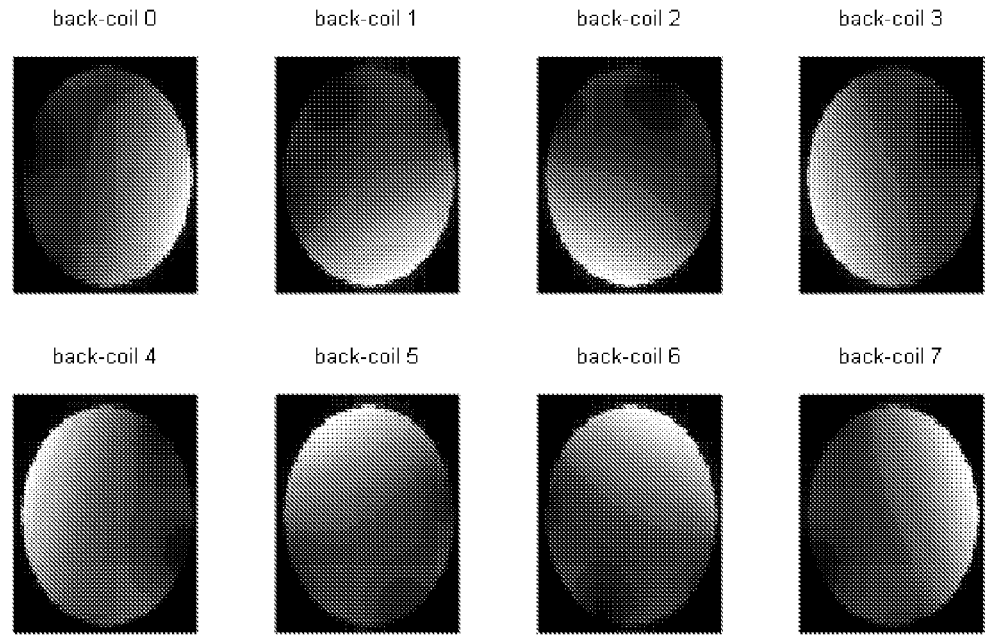
Figure 7:
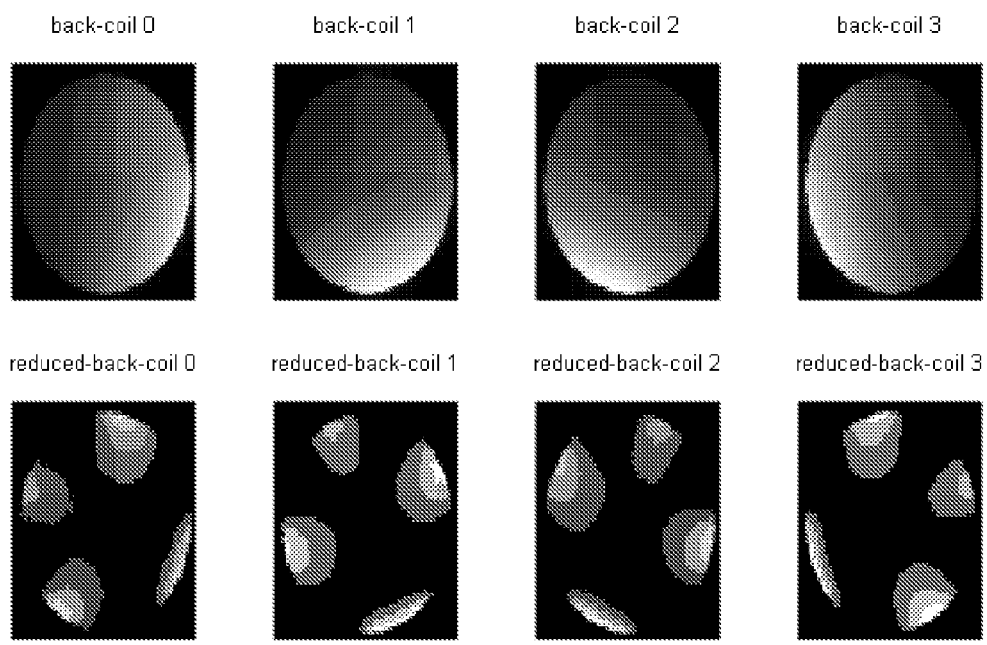

With reference to FIGS. 4-7, some $B_1$ maps for the above-described $B_1$ mapping are presented. The intended application here is a body MR image performed as a two-dimensional scan in an oblique orientation. To compensate for the $B_1$ variation in such imaging, $B_1$ shimming is advantageously performed. An eight-channel transmit system is assumed here (that is, N=8 for this example). Based on the slice geometry information (FOV, slice orientation), the 3D trained coil sensitivities are reformatted from the representation S' using interpolation and extrapolation techniques. The reformatted sensitivities for the individual coils are analyzed according to the relationship $E=U^H \times S$. In this example, four Eigenmodes are used for the $B_1$ mapping, which reduces the $B_1$ mapping time for the eight-coil system by a factor of two. An "all but one" measuring scheme is chosen. The corresponding encoding matrix A is considered to be a real one, for simplicity. All elements of A are identical to one, but the diagonal elements were set to zero to implement the "all-but-one" measuring scheme. (This is merely an example—other encoding matrices are also contemplated. For example, in other embodiments the corresponding eigenvalues for the different eigenmodes are taken into account in order to select optimal encoding matrices A to improve the accuracy of the mapping procedure for all modes to be measured). After selecting the encoding scheme, the channel drive scales for the fast $B_1$ mapping are derived and the measurements are performed at a desired spatial resolution. Based on the four measured eigenmodes the coil sensitivities and hence the $B_1$ shimming coefficients are derived. FIG. 4 shows the coil sensitivities ($B_1$ maps) for the eight-coil system. FIG. 5 shows the eigenmodes of order 0-7. FIG. 6 shows the coil sensitivities ($B_1$ maps) for the eight-coil system computed as described from measurements of only the four lowest order eigenmodes encoded using the "all-but-one" encoding scheme. Comparison of FIGS. 4 and 6 shows that the omission of the four highest order eigenmodes has relatively little effect on the obtained coil sensitivities. Finally, the top row of FIG. 7 reproduces the top row of FIG. 6, while the bottom row of FIG. 7 shows the difference between (i) these coil sensitivities obtained by omitting the higher order eigenmodes and (ii) the actual coil sensitivities shown in FIG. 4. Again, very little difference is seen except near the outer extremities of the FOV.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A method comprising:
   performing a number of $B_1$ field mapping sequences using a set of radio frequency transmit coils to acquire a $B_1$ field mapping data set wherein said number is less than a number of radio frequency transmit coils in the set of radio frequency transmit coils; and
   determining coil sensitivities for the set of radio frequency transmit coils based on the acquired $B_1$ field mapping data set.

2. The method as set forth in claim 1, wherein the performed $B_1$ field mapping sequences are defined by (i) performing a linear transform on the set of radio frequency transmit coils to generate a set of orthogonal virtual radio frequency transmit coils and (ii) selecting a sub-set of the set of orthogonal virtual radio frequency transmit coils that define the performed $B_1$ field mapping sequences.

3. The method as set forth in claim 2, wherein the linear transform is an eigenmode transform.

4. The method as set forth in claim 3, wherein the selecting operation (ii) comprises:
   selecting a plurality of virtual radio frequency transmit coils having the lowest eigenmode orders of the set of orthogonal virtual radio frequency transmit coils.

5. The method as set forth in claim 2, wherein the performed $B_1$ field mapping sequences are further defined by (iii)

encoding a coil of the selected sub-set using the set of radio frequency transmit coils as an encoding basis to determine corresponding amplitude and phase values for the radio frequency transmit coils of the set of radio frequency transmit coils.

6. The method as set forth in claim 2, wherein the selecting operation (ii) comprises omitting from the selected sub-set those virtual radio frequency transmit coils that generate a $B_1$ transmit field with principally high spatial frequency content.

7. The method as set forth in claim 2, wherein the determining coil sensitivities comprises applying an inverse transform corresponding to the linear transform to the acquired $B_1$ field mapping data set to generate an acquired $B_1$ field mapping data set in the basis of the set of radio frequency transmit coils.

8. The method as set forth in claim 1, wherein the performed number of $B_1$ field mapping sequences is less than or equal to one-half of the number of radio frequency transmit coils in the set of radio frequency transmit coils.

9. The method as set forth in claim 1, wherein each $B_1$ field mapping sequence is performed using all but one of the radio frequency transmit coils in the set of radio frequency transmit coils.

10. The method as set forth in claim 1, wherein each performed $B_1$ field mapping sequence omits a different one of the radio frequency transmit coils in the set of radio frequency transmit coils.

11. The method as set forth in claim 1, wherein the determining coil sensitivities for the set of radio frequency transmit coils based on the acquired $B_1$ field mapping data set comprises:
adjusting a stored set of coil sensitivities for the set of radio frequency transmit coils based on the acquired $B_1$ field mapping data set.

12. The method as set forth in claim 1, further comprising:
performing $B_1$ shimming using the coil sensitivities determined for the set of radio frequency transmit coils based on the acquired $B_1$ field mapping data set.

13. A storage medium storing instructions executable by a digital processor to perform a method as set forth in claim 1.

14. A digital processor configured to perform a method as set forth in claim 1.

15. A magnetic resonance system comprising:
a magnetic resonance scanner;
a set of radio frequency transmit coils; and
a digital processor configured to perform a method as set forth in claim 1, wherein the performing a number of $B_1$ field mapping sequences comprises causing the magnetic resonance scanner to perform said $B_1$ field mapping sequences using said set of radio frequency transmit coils.

* * * * *